United States Patent
Feustel et al.

(10) Patent No.: US 7,989,352 B2
(45) Date of Patent: Aug. 2, 2011

(54) TECHNIQUE FOR REDUCING PLASMA-INDUCED ETCH DAMAGE DURING THE FORMATION OF VIAS IN INTERLAYER DIELECTRICS

(75) Inventors: Frank Feustel, Dresden (DE); Kai Frohberg, Niederau (DE); Thomas Werner, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 952 days.

(21) Appl. No.: 11/696,226

(22) Filed: Apr. 4, 2007

(65) Prior Publication Data
US 2008/0057705 A1    Mar. 6, 2008

(30) Foreign Application Priority Data

Aug. 31, 2006 (DE) .......................... 10 2006 041 004

(51) Int. Cl.
*H01L 21/302* (2006.01)
*H01L 21/461* (2006.01)

(52) U.S. Cl. ........ 438/710; 438/712; 438/637; 438/624; 438/736

(58) Field of Classification Search .................. 438/706, 438/710, 712, 637, 624, 736
See application file for complete search history.

(56) References Cited

U.S. PATENT DOCUMENTS

| 6,025,273 A * | 2/2000 | Chen et al. ..................... 438/706 |
| 6,090,674 A | 7/2000 | Hsieh et al. ..................... 438/301 |
| 6,171,951 B1 | 1/2001 | Lee et al. ..................... 438/640 |
| 6,495,919 B2 | 12/2002 | Farrar ..................... 257/759 |
| 2001/0041444 A1 | 11/2001 | Shields et al. ............... 438/689 |
| 2004/0000722 A1 | 1/2004 | Powers ..................... 257/774 |
| 2007/0111487 A1 * | 5/2007 | Kim et al. ..................... 438/478 |

FOREIGN PATENT DOCUMENTS

| DE | 31 38 960 A1 | 9/1981 |
| DE | 102004001672 A1 | 9/2004 |
| WO | WO 98/09318 | 3/1998 |

OTHER PUBLICATIONS

Translation of Official Communication from German Patent Office for German Patent Application No. 10 2006 041 004.1-33 dated May 19, 2010.

* cited by examiner

*Primary Examiner* — Matthew Smith
*Assistant Examiner* — John M Parker
(74) *Attorney, Agent, or Firm* — Williams, Morgan & Amerson, P.C.

(57) ABSTRACT

By forming a conductive material within an etch mask for an anisotropic etch process for patterning openings, such as vias, in a dielectric layer of a metallization structure, the probability for arcing events may be reduced, since excess charge may be laterally distributed. For example, an additional sacrificial conductive layer may be formed or an anti-reflecting coating (ARC) may be provided in the form of a conductive material in order to obtain the lateral charge distribution.

13 Claims, 5 Drawing Sheets

TECHNIQUE FOR REDUCING PLASMA-INDUCED ETCH DAMAGE DURING THE FORMATION OF VIAS IN INTERLAYER DIELECTRICS

BACKGROUND OF THE INVENTION

1. Field of the Invention

Generally, the present disclosure relates to integrated circuits, and, more particularly, to the manufacture of metallization layers including conductive materials, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, that are filled with an appropriate metal. Thus, the vias provide the electrical connection between two neighboring stacked metallization layers, wherein the metal-containing lines and vias may also be commonly referred to as interconnect structures.

Due to the continuous reduction of feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The vias may typically be formed by etching an opening into a respective interlayer dielectric material, which, in sophisticated applications, may be a low-k material in combination with a highly conductive metal, such as copper or copper alloys, and subsequently filling the opening with an appropriate conductive material. Due to the reduced dimensions of the vias, sophisticated anisotropic etch techniques are usually necessary for forming the high aspect ratio openings.

It turns out that the process of etching vias in the dielectric layer may significantly affect the overall production yield during the formation of advanced semiconductor devices owing to substrate damage caused by plasma-assisted etch processes.

Figure 1:
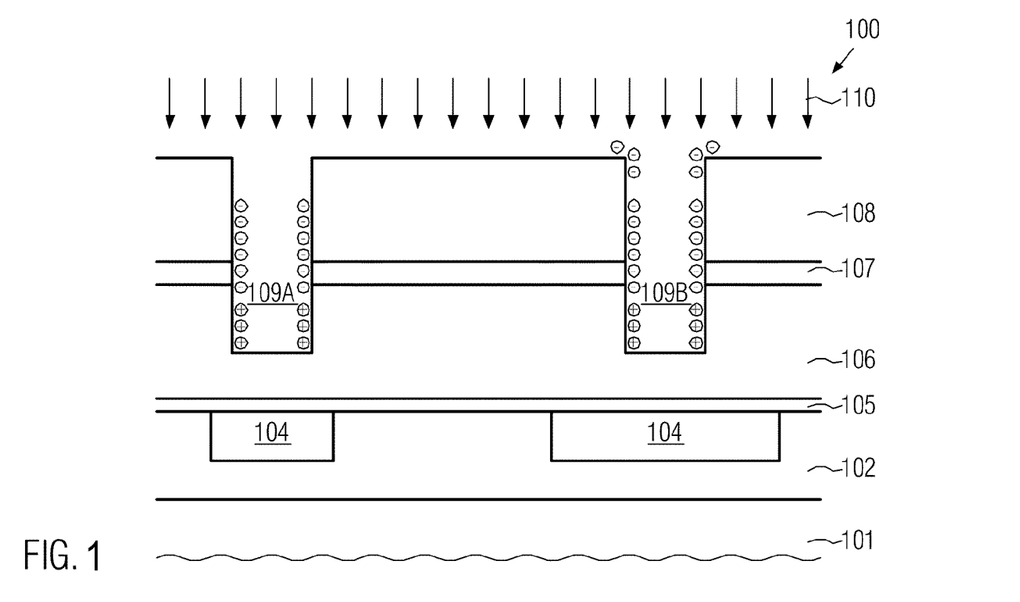
FIG. 1 schematically illustrates a cross-sectional view of a conventional semiconductor device during the formation of via openings of a metallization structure with an increased probability for occurrence of arcing events.

With reference to FIG. 1, a typical conventional process flow will now be described in more detail, wherein via openings for a metallization structure of an advanced semiconductor device are formed on the basis of a plasma-assisted etch process.

FIG. 1 schematically illustrates a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, contact portions and the like. For convenience, in FIG. 1, a respective layer 102 is illustrated as representative of any circuit elements or contact portions to which a vertical electrical connection is to be formed, as will be described later on in more detail. The layer 102 may, for instance, be comprised of any appropriate dielectric material, such as silicon dioxide, silicon nitride, silicon oxynitride and low-k dielectric materials, wherein a low-k dielectric material is to be understood as a material having a dielectric constant that is 3.0 or less. For example, the layer 102 may represent a portion of a metallization structure of the device 100, in which may be formed respective metal regions 103, 104, which may represent metal lines, extended metal regions and the like, depending on the device requirements. The metal regions 103, 104 may be comprised of any appropriate material, such as copper, copper alloys or combinations of various different materials, wherein typically conductive barrier materials may be provided, especially when copper-based metal regions are considered. For example, the metal regions 103, 104 may differ in their lateral dimensions depending on the corresponding device design. It should be appreciated that other circuit elements, such as semiconductor devices and the like, may be formed in any appropriate device layer located below the layer 102. Furthermore, an etch stop layer 105 may be provided on the layer 102, followed by a dielectric layer 106, such as a low-k dielectric layer, when sophisticated semiconductor devices are considered, in which any parasitic capacitance between neighboring metal regions is to be reduced. In other cases, the dielectric material of the layer 106 may comprise other appropriate materials, such as silicon dioxide, silicon nitride, silicon oxynitride, fluorine-doped silicon dioxide and the like. More-over, a respective anti-reflective coating (ARC) layer 107 may be formed on the dielectric layer 106 followed by a resist mask 108. Furthermore, in the manufacturing stage shown in FIG. 1, respective openings 109A, 109B may be partially formed in the dielectric layer 106, wherein these openings 109A, 109B in this example may have to extend into the respective metal regions 103, 104 in order to provide an electrical connection, for instance, for a further metallization layer to be formed above the dielectric layer 106.

A typical process flow for forming the semiconductor device 100 as shown in FIG. 1 may comprise the following processes. After manufacturing respective semiconductor elements (not shown) in one or more appropriate semiconductor layers formed above the substrate 101, the dielectric layer 102 may be formed on the basis of well-established deposition techniques, such as chemical vapor deposition (CVD) wherein a plurality of recipes are established for various materials. Thereafter, the metal regions 103, 104 may be formed on the basis of appropriate etch techniques followed by respective metal deposition processes, such as CVD, electrochemical techniques and the like. Next, the etch stop layer 105 may be formed on the basis of a CVD process, wherein the material composition of the etch stop layer 105 may also be selected in view of a reliable confinement of the metal in the regions 103 and 104. Then, the dielectric layer 106 may be formed on the basis of any appropriate deposition technique for providing the dielectric material having the desired characteristics. Thereafter, well-established lithography processes may be performed, which may include the deposition of the ARC layer 107 having optical characteristics so as to avoid undue back reflection of exposure radiation used for selectively exposing the resist layer 108, which may be formed on the ARC layer 107 on the basis of spin-on techniques in order to form a respective etch mask.

After the patterning of the resist layer 108, an anisotropic etch process 110 may be performed in order to etch into the dielectric layer 106 on the basis of the overlying patterned resist layer 108 and the patterned ARC layer 107. Typically, the etch process 110 has to exhibit a highly anisotropic behavior due to the moderately low lateral dimensions required for the openings 109A, 109B for a given thickness of the layer 106. Thus, well-established plasma-assisted recipes are used for the process 110, wherein, in a typical plasma-based etch process, reactive ions are created and are accelerated towards the substrate 101 in order to obtain a high directionality for providing a moderately high physical component, which is substantially oriented perpendicular to the surface of the device 100. Furthermore, respective polymer materials may be added to the etch ambient of the process 110 in order to appropriately reduce a lateral etching, while substantially not affecting the vertical progress of the corresponding etch front.

Due to the highly complex conditions within the plasma etch ambient, increasingly positive ions may accumulate in a lower portion of the respective openings 109A, while negative charge may accumulate in an upper portion thereof, thereby increasingly building up a vertical potential difference. Consequently, due to the highly local separation of positive and negative charges, a highly localized potential difference may be created in the vicinity of the respective openings 109A, 109B wherein, under certain conditions, a so-called arcing event may occur when the potential difference rises to a critical value. During the arcing, burnt metal and "worm-like" arcing marks may be created, thereby resulting in a significant loss of production yield, as corresponding arcing events may render the respective device unusable. Thus, the frequency of arcing events may significantly affect the yield per substrate, wherein, however, the occurrence of arcing events is difficult to predict, wherein experience indicates that plasma instabilities and surface structure conditions, such as pattern density, the presence of lower lying metal regions and the like, may have a significant influence. For instance, the frequency of arcing events during dielectric etch processes may be extremely low in the absence of lower lying metal regions, whereas a significant increase of the frequency of arcing events may be observed during the formation of metallization structures of sophisticated semiconductor devices. In particular, during the formation of respective via openings, such as the openings 109A, 109B, a high probability for the occurrence of arcing events may be observed especially, if higher laying metallization layers are involved. Furthermore, as is illustrated in FIG. 1, the local charge separation occurring at the different openings 109A, 109B may not be identical, since the corresponding etch conditions may vary locally, for instance due to a different device configuration in the vicinity of the respective openings, such as the differently sized metal regions 103, 104 and the like. For instance, in the example shown, a plurality of laterally spaced openings, such as the opening 109A, may be formed with a moderately low degree of charge separation, while the opening 109B may build up, due to a locally different environment, a moderately high potential difference, thereby significantly increasing the probability for an arcing event, which may then result in a total loss of the entire device 100, even though a high number of less critical openings 109A may be commonly formed with the opening 109B. Consequently, a significant yield loss may occur at a moderately late stage of the manufacturing process flow for forming the device 100 due to plasma-induced damage.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming openings in a dielectric layer on the basis of a plasma-assisted etch process, wherein plasma-induced local potential differences at respective openings may be laterally balanced, at least to a certain degree, thereby significantly reducing the probability of building up an over-critical potential difference at individual openings. Consequently local differences, for instance due to structural differences, locally occurring plasma instabilities and the like, may be efficiently "distributed" among a plurality of openings, thereby generally reducing the probability of creating a single over-critical situation. Thus, yield loss may be significantly reduced.

According to one illustrative embodiment disclosed herein, a method comprises forming a conductive charge equalization area above a dielectric layer of a metallization structure of a microstructure device, wherein the charge equalization area connects laterally spaced regions of the dielectric layer wherein each of the regions receives an opening for receiving a conductive material therein. Furthermore, a plasma-assisted etch process is performed to form the openings.

According to another illustrative embodiment disclosed herein, a method comprises introducing an ion species into a sacrificial material layer formed above a dielectric layer of a metallization structure of a microstructure device, wherein the ion species modifies an electrical behavior of the sacrificial layer. Furthermore, the sacrificial layer is patterned to form an etch mask and, finally, a plurality of laterally spaced openings is formed in the dielectric layer based on a plasma-assisted etch process by using the etch mask.

According to yet another illustrative embodiment disclosed herein, a method comprises forming a mask layer above a dielectric layer of a metallization structure of a microstructure device, wherein the mask layer comprises an electrically conductive layer. Furthermore, the mask layer is patterned to obtain an etch mask for a plurality of openings to be formed in the dielectric layer. Finally, the openings are formed by a plasma-assisted etch process using the etch mask.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for forming openings in a dielectric layer of a metallization structure of a microstructure device, such as a semiconductor device and the like, wherein an increased uniformity of the local charge separation mechanisms is provided. For this purpose, the electrical characteristics of a corresponding mask layer used for patterning the respective openings and, in some illustrative embodiments, additionally the electrical characteristics of the dielectric layer, may be modified to provide more uniform process conditions for the plasma-assisted etch process. The "balancing" of the respective local etch conditions may, in some illustrative embodiments, be obtained on the basis of an electrically conductive portion within the mask layer so as to allow, at least to a certain degree, a charge carrier transport in the lateral direction, thereby enabling a current flow between laterally adjacent etch positions to significantly reduce the probability for arcing events at specific etch positions, at which local conditions may generally lead to a higher degree of vertical charge separation that may potentially result in an over-critical potential. In some illustrative embodiments, a corresponding laterally conductive portion may be provided in combination with an additional mechanism for modifying the vertical charge separation mechanism within the respective openings during the etch process. For instance, the "screening" effect at the etch position with respect to underlying device areas may be enhanced by introducing an appropriate species, which may therefore reduce the vertical charge separation, thereby also reducing the probability for obtaining an over-critical situation with respect to the occurrence of an arcing event.

Figure 2A:
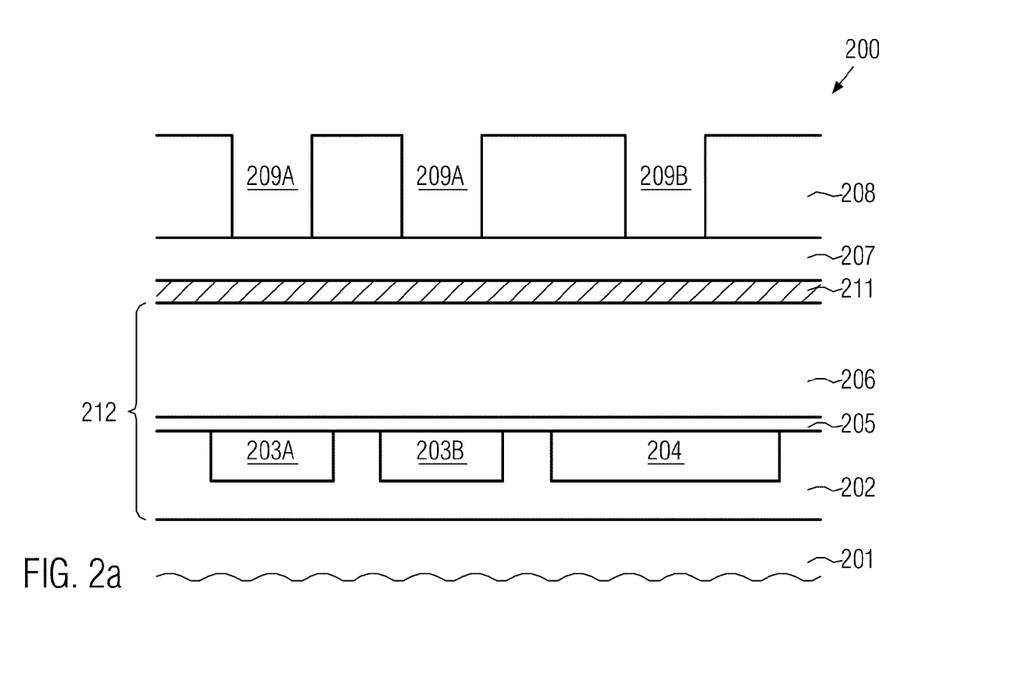
FIGS. 2a-2e schematically illustrate cross-sectional views of a microstructure device in various process stages for forming openings in a dielectric layer on the basis of a plasma-assisted etch process, wherein electrically conductive areas for laterally equalizing potential differences are provided according to illustrative embodiments disclosed herein.

FIG. 2a schematically illustrates a microstructure device 200, which, in one illustrative embodiment, may represent a semiconductor device including a plurality of circuit elements, such as transistors, capacitors and the like. The device 200 may comprise a substrate 201, which may represent any appropriate carrier material, such as a semiconductor substrate, an insulating substrate having formed thereon appropriate material layers, such as semiconductor layers, for forming thereon and therein respective device features, and the like. In some illustrative embodiments, the substrate 201 may represent a silicon-based substrate, such as a silicon bulk substrate and a silicon-on-insulator (SOI) substrate, which may be highly advantageous for forming therein and thereon sophisticated integrated circuits, such as CPUs, memory devices and the like.

The device 200 may further comprise a metallization structure 212, which may include in this manufacturing stage a dielectric layer 202 having formed therein conductive regions 203A, 203B and 204. For instance, the dielectric layer 202 may represent any appropriate dielectric material, such as low-k dielectric materials in the form of polymer materials, porous silicon-based materials and the like. In other cases, the dielectric layer 202 may be comprised of standard dielectric materials, such as silicon dioxide, silicon nitride, silicon carbide, silicon oxynitride and the like. It should be appreciated that the dielectric layer 202 may be comprised of a plurality of different materials and layers, depending on device requirements. The conductive regions 203A, 203B may have, in the example shown, similar lateral dimensions, while the conductive region 204 may represent a region of increased lateral dimensions in order to exemplify any type of structural differences at respective portions above which appropriate openings are to be formed. It should be appreciated, however, that the respective conductive regions 203A, 203B and 204 in other situations may have substantially the same configuration, wherein respective differences during a subsequent etch process may be caused by other spatially different conditions, such as plasma non-uniformities and the like. In some illustrative embodiments, the regions 203A, 203B and 204 may comprise highly conductive metals, such as copper, copper alloys and the like, possibly in combination with respective conductive barrier materials, such as tantalum, tantalum nitride, tungsten, cobalt, boron, phosphorous and the like.

Furthermore the metallization structure 212 may comprise an etch stop layer 205, which may be comprised of any appropriate material, such as silicon nitride, silicon carbide, nitrogen-enriched silicon carbide, oxygen-enriched silicon carbide and the like. A dielectric layer 206 is formed on the etch stop layer 205 and may be comprised of a dielectric material according to device requirements. In advanced semiconductor devices, the metallization structure 212 may be formed on the basis of low-k dielectric materials, wherein the dielectric layer 202, the dielectric layer 206, or both layers, may be formed on the basis of low-k dielectric materials having a relative permittivity of 3.0 or less or 2.8 or less.

Formed above the dielectric layer 206, which is to be patterned in a subsequent etch process for receiving respective openings, is a conductive charge equalization area 211, which may, in the embodiment illustrated, be provided in the form of a conductive layer comprised of any appropriate material. For instance, the layer 211 may be formed from a conductive polymer material, a metal, a semiconductor material, doped or undoped, and the like. For instance, the material of the layer 211 may be provided with a specific resistance of several hundred ohm per centimeter to several milli ohms per centimeter, or even less, when a moderately high conductivity is desired. In other embodiments, significantly higher specific resistances may be contemplated as long as a desired lateral charge carrier transport may be accomplished. Appropriate conductivity values for the layer 211 may be obtained on the basis of even weakly doped semiconductor layers, such as polysilicon and the like, conductive polymer materials, or by basically insulating materials receiving an appropriate modification by introducing an appropriate ion species, as will be described later on in more detail. Furthermore, the device 200 as shown in this embodiment may comprise an anti-reflective coating (ARC) layer 207 formed of any appropriate material, such as silicon oxynitride, oxygen-containing silicon carbide, polymer materials and the like. Moreover, a resist mask 208 may be formed above the layers 211 and 207 including respective openings 209A, 209B as required for patterning the dielectric layer 206.

A typical process flow for forming the microstructure device 200 as shown in FIG. 2a may comprise the following processes. After forming any circuit elements, if required, in and above the substrate 201, the metallization structure 212 may be manufactured on the basis of well-established techniques, wherein any appropriate materials and processes may be used. In sophisticated applications, the conductive regions 203A, 203B and 204 may represent contact portions, electrode portions, metal lines and the like, with different lateral and/or vertical dimensions depending on the device requirements. Consequently, any appropriate manufacturing regimes may be used, such as inlaid or damascene techniques, when copper-based metallization structures are considered. Thereafter, the etch stop layer 205 and the dielectric layer 206 may be formed on the basis of any appropriate techniques, as is also described with reference to the semiconductor device 100. For example, the dielectric layer 206 may be formed on the basis of CVD techniques, spin-on techniques and the like, wherein even different techniques may be used in combination if respective material compositions are to be provided for the layer 206. For example, low-k dielectric materials may frequently exhibit a reduced mechanical stability compared to conventional materials, such as silicon dioxide, silicon nitride and the like, which may be compensated for, at least partially, by providing a respective cap layer (not shown) having an enhanced mechanical strength. In other cases, the dielectric layer 206 may represent the interlayer dielectric material for a subsequent metallization layer, wherein a lower portion may have to accommodate respective vias, while an upper portion thereof may receive respective metal lines, wherein different dielectric characteristics may be provided for the different layer portions. Irrespective of the process strategy for forming the dielectric layer 206, the conductive charge equalization layer 211 may be formed, at least at a specific device region, in which an increased probability for arcing events may be expected. Thus, the layer 211 may be provided in a locally selective manner or in a global manner by any appropriate manufacturing technique, including spin-on techniques, when conductive polymer materials are considered, or other appropriate deposition techniques for metal-containing layers, semiconductor layers and the like. For instance, if a cap layer is to be provided for the dielectric material of the layer 206, an appropriate deposition sequence may be performed to provide a highly insulating material in a first phase and subsequently deposit a material of reduced insulating characteristics, wherein an appropriate species may be incorporated for adjusting the degree of conductivity.

In other cases, the respective electrical characteristics may be modified in a separate manufacturing process, as will be described later on. In still other illustrative embodiments, metal-containing materials may be deposited on the basis of sputter deposition techniques, CVD and the like, when a high conductivity is desired. Next, the ARC layer 207 may be formed on the basis of any appropriate process followed by the deposition and patterning of the resist mask 208. Thereafter, the layers 207 and 211 may be patterned on the basis of the mask 208 and subsequently a respective etch process may be performed to form respective openings in the dielectric layer 206. It should be appreciated that, in other illustrative embodiments, any combination of the layers 211, 207 and 208 may be considered as a mask layer which may be appropriately patterned to act as an etch mask during a subsequent anisotropic etch process for patterning the layer 206. For this purpose, the corresponding mask layer may be configured in any appropriate manner, for instance by providing the resist mask 208 only temporarily for patterning the layers 207 and 211, which may then, in combination, act as an etch mask when the thickness of the resist layer 208 is deemed to be inappropriate for obtaining the desired etch behavior. In this case, the layer 207 may provide the desired high degree of etch selectivity during the subsequent anisotropic etch process.

Figure 2B:
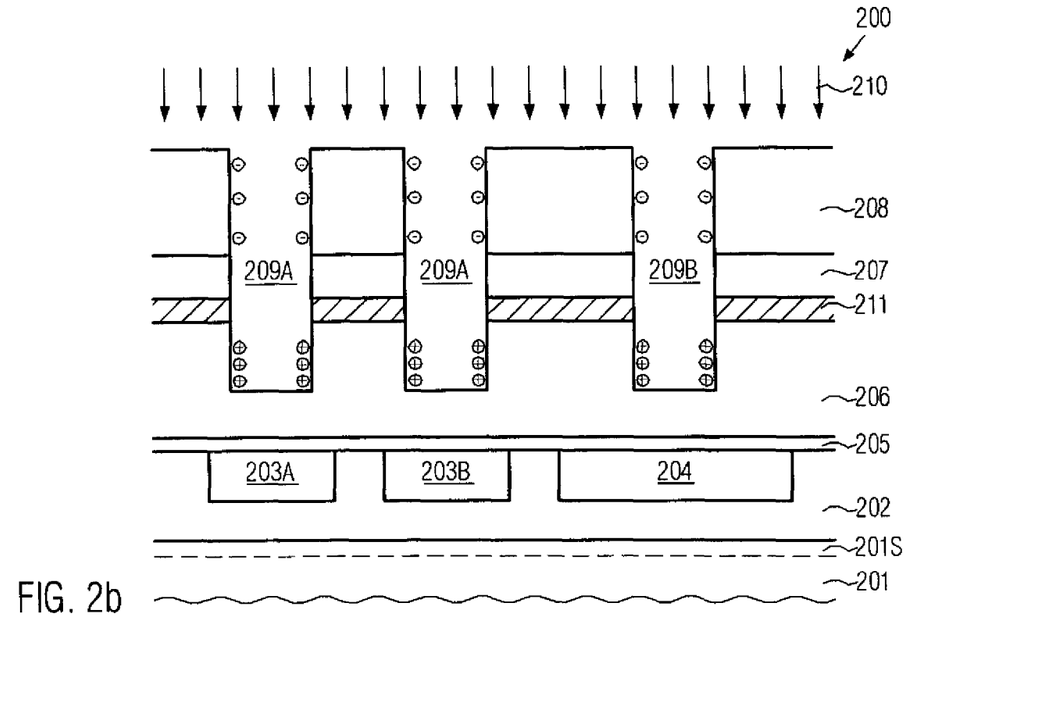

FIG. 2b schematically illustrates the device 200 in a further advanced manufacturing stage, wherein an anisotropic etch process 210 based on a plasma ambient is performed to transfer the openings 209A, 209B into the dielectric layer 206. As previously explained, a locally varying degree of charge separation may occur at the respective etch positions corresponding to the openings 209A, 209B which may depend on the device configuration, i.e., the pattern density, differences in the dimensions of respective conductive regions located in the vicinity of respective etch positions, fluctuations of the respective plasma ambient of the process 210 and the like. For convenience, in the example shown in FIG. 2b, a corresponding non-uniformity of respective etch conditions is represented by a difference of the lateral size of the regions 203A, 203B compared to the region 204. In this respect, it may be appreciated that any positional information, such as lateral, vertical, horizontal, above, below and the like, may be understood as referring to the substrate 201, i.e., a respective surface 201S thereof. Hence, a lateral or horizontal direction refers to a direction substantially parallel to the surface 201S, while a vertical direction is substantially perpendicular to the surface 201S. Similarly, the layer 206 is formed above the layer 202 in the sense that the layer 202 is located closer to the surface 201S.

During the etch process 210, the respective etch positions corresponding to the openings 209A, 209B are therefore electrically connected to each other, at least at a height level corresponding to the vertical position of the layer 211. For instance, if the openings 209A, 209B represent corresponding via openings, the intermediate areas between the respective via openings 209A, 209B are electrically connected by the layer 211. Even if some of the openings 209A, 209B may represent trenches having a significant lateral extension in the direction perpendicular to the drawing plane of FIG. 2b, at least an electrical connection between two adjacent openings 209A, 209B is accomplished by the layer 211. For example, the region 209B may represent a deep trench corresponding to a chip border which may be commonly formed with respective via openings, such as the openings 209A, in any inner chip areas, wherein, nevertheless, an efficient electrical contact between areas corresponding to the openings 209A and the opening 209B is established. Consequently, device-specific non-uniformities, i.e., differences in pattern density and other device configurations, may be efficiently compensated for or at least be significantly reduced with respect to the local etch conditions at the respective openings 209A, 209B. For instance, if an increased charge separation may occur within the opening 209B, for instance due to the increased metal region 204, excess charge may be discharged from the opening 209B via the layer 211, since a lateral potential difference may be generated with respect to the openings 209A, thereby significantly reducing the probability for creating an overcritical situation at the opening 209B. Similarly, if any other plasma non-uniformities may be encountered at any of the openings 209A, 209B, a corresponding "equalization" may be achieved via the layer 211, thereby significantly reducing the risk for substrate arcing, since the excess charge may be substantially equally distributed across the layer 211.

After completely forming the openings 209A, 209B within the layer 206 and the layer 205, the further processing may be continued similar to conventional strategies, wherein additionally the charge equalization layer 211 may be removed prior to or after a corresponding process for filling the respective openings 209A, 209B with a conductive material to insulate the corresponding conductive openings 209A, 209B from each other. After the removal of the layer 211, the further processing may then be continued on the basis of conventional strategies.

Figure 2C:
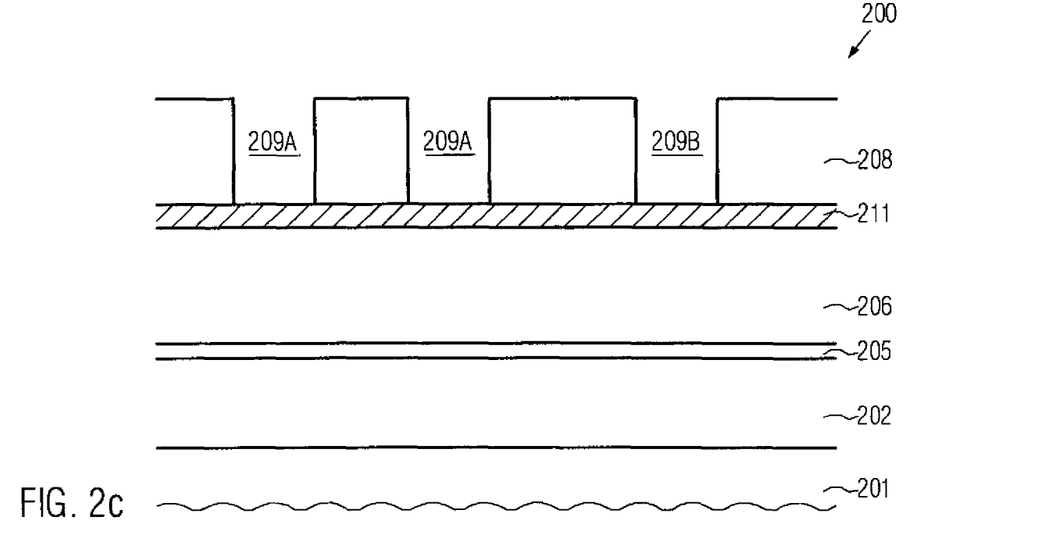

FIG. 2c schematically illustrates the microstructure device 200 according to further illustrative embodiments, wherein the device as shown in FIG. 2c may have a similar configuration as the device 200 shown in FIG. 2a. In the embodiment shown in FIG. 2c, the electrically conductive area or layer 211 may be provided in the form of an ARC material, that is, the optical characteristics of the layer 211 may, in addition to the desired degree of electrical conductivity, be selected such that a desired optical behavior during the exposure of the resist mask 208 may be accomplished. For instance, a wide class of polymer materials is available from which appropriate candidates with respect to the desired electrical conductivity and the optical characteristics may be selected. For instance, by incorporating a metal-containing component into the polymer material, the extinction coefficient may even be increased in some cases, thereby providing a high absorption capability of the layer 211 while also providing the desired electrical characteristics. In other illustrative embodiments, silicon-based materials may be used wherein the conductivity thereof may be adjusted by incorporating an appropriate species during the deposition of the silicon-based material. As previously explained, the corresponding conductive species may be incorporated at an upper portion of the layer 211, when a highly insulating behavior of a lower portion of the layer 211 in contact with the dielectric material 206 may be required in view of the further processing of the device 200, in order to reliably avoid undesired electrical connections between adjacent conductive regions to be formed in the dielectric layer 206.

With respect to manufacturing processes for the device 200 as shown in FIG. 2c, the same criteria apply as previously explained, wherein the layer 211 may be formed on the dielectric layer 206 on the basis of techniques described above and thereafter the resist layer 208 may be patterned in accordance with previously described processes. The further processing, i.e., performing the anisotropic etch process 210, may then be continued in a similar manner, wherein the layer 211, or at least a conductive portion thereof, provides the desired charge carrier distribution during the etch process 210.

Figure 2D:
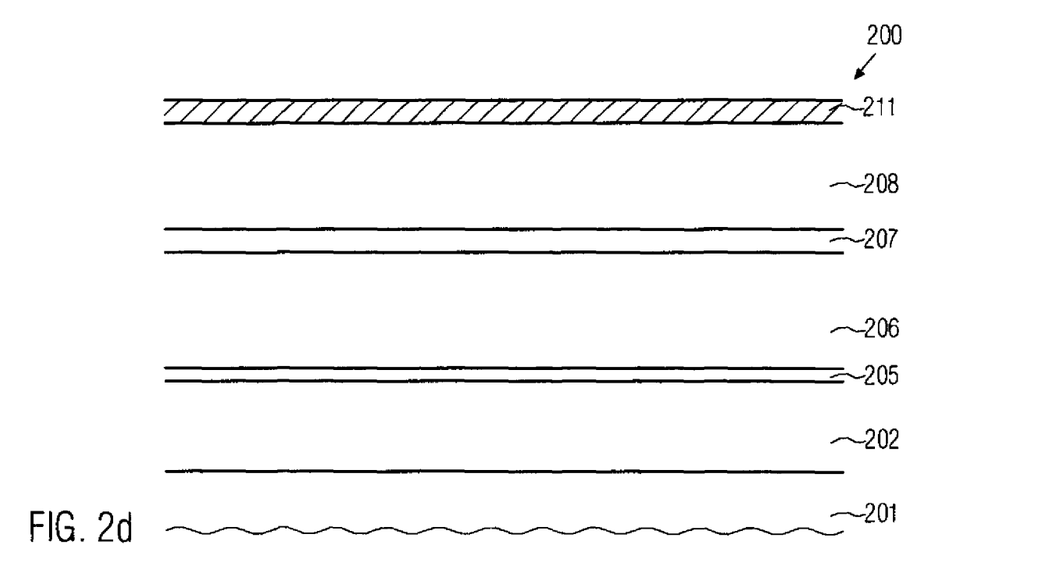

FIG. 2d schematically illustrates the device 200 according to further illustrative embodiments in a manufacturing stage prior to the patterning of the resist layer 208. In these embodiments, the components 202-208 may be formed on the basis of process techniques previously described, wherein the conductive layer 211 may be formed on top of the resist layer 208 in order to act as a top ARC material during the exposure of the resist layer 208. Hence, similar techniques as described above may be used for providing the desired optical characteristics in addition to the required electrical conductivity of the layer 211. For instance, electrically conductive polymer materials may be efficiently used for forming the layer 211. Thereafter, the resist layer 208 and thus the top ARC layer 211 may be patterned on the basis of well-established techniques in order to form respective openings, such as the openings 209A, 209B (FIG. 2c) for patterning the dielectric layer 206. It should be appreciated that, in this case, the bottom ARC layer 207 may be omitted if the top ARC layer 211 having the electrical conductivity provides a sufficient quality during the exposure process. Thereafter, the further processing may be continued by performing the anisotropic etch process 210 wherein the layer 211, having a moderately high etch selectivity with respect to the material of the layer 206, may provide charge carrier distribution, as is previously described.

Figure 2E:
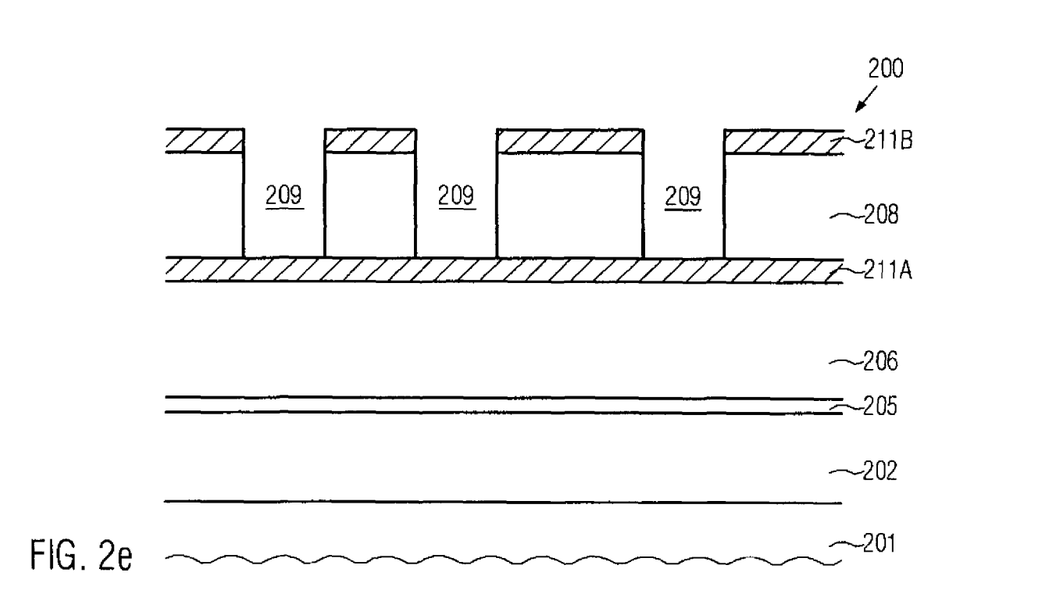

FIG. 2e schematically illustrates the device 200 according to further illustrative embodiments in which two or more electrically conductive layers may be provided during the etch process 210 to increase the charge carrier distribution capability. In this embodiment, the device 200 may comprise the resist mask 208 in combination with an electrically conductive layer 211A formed between the dielectric layer 206 and the resist material and with a second conductive layer 211B formed above the resist mask 208. In one illustrative embodiment, both layers 211A, 211B may additionally act as an anti-reflective coating in order to provide the desired optical characteristics. For instance, if the incorporation of conductive material into a corresponding base material may negatively affect the optical characteristics, both layers 211A, 211B in combination may nevertheless provide the desired high degree of exposure quality. Furthermore, the etch selectivity of the layer 211B may be less critical compared to the embodiments described with reference to FIG. 2d since, even after a significant material removal of the layer 211B, the layer 211A may still provide charge carrier distribution. In other illustrative embodiments, the layer 211A may not provide ARC characteristics and instead a further bottom ARC, such as the layer 207 in FIG. 2a, may be additionally provided in combination with the layers 211A, 211B in order to obtain an enhanced charge equalization mechanism during the subsequent anisotropic etch process.

With reference to FIGS. 3a-3d, further illustrative embodiments will now be described in more detail, in which, additionally or alternatively, electrical characteristics of layers used during the patterning of a dielectric layer may be modified in order to provide enhanced etch uniformity with respect to charge separation.

Figure 3A:
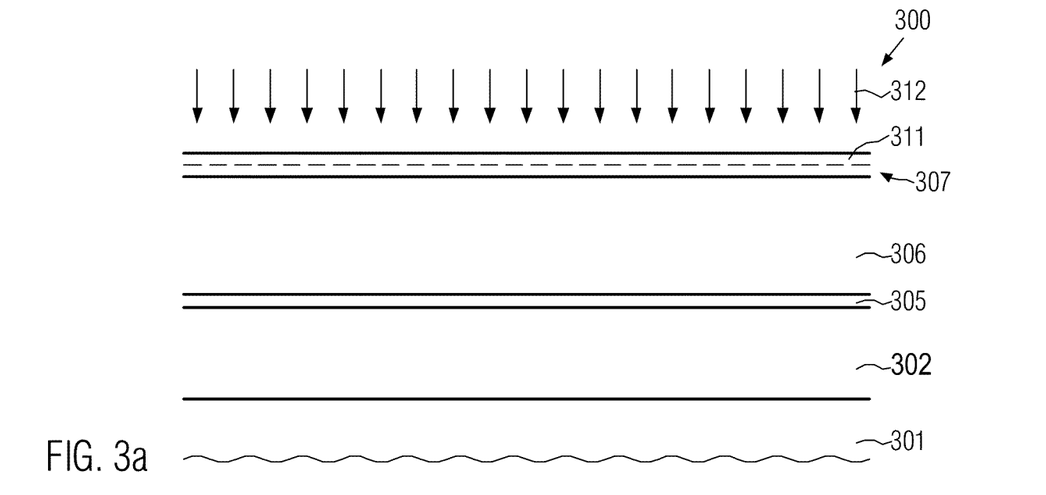
FIGS. 3a-3d schematically illustrate cross-sectional views of a microstructure device for forming openings on the basis of a reduced lateral potential difference obtained by incorporating an appropriate ionic species according to other illustrative embodiments disclosed herein.

FIG. 3a schematically illustrates a microstructure device 300 according to some illustrative embodiments in which a dielectric layer 306 may be patterned to receive respective openings, as is previously described. The layer 306 may be formed above a corresponding device configuration including a substrate 301, a device layer 302 and an etch stop layer 305, wherein the respective components may have substantially the same characteristics as is previously described for the corresponding components of the devices 200 and 100. Furthermore, a layer 307 may be formed above the dielectric layer 306 to be patterned, wherein the layer 307 may represent any appropriate material layer which may, for instance, impart an increased mechanical stability to the layer 306, when comprised of a low-k dielectric material. In other cases, the layer 307 may represent an ARC material, while, in other illustrative embodiments, the layer 307 may represent any sacrificial layer used to provide the desired electrical behavior during a subsequent anisotropic etch process. In one illustrative embodiment, the layer 307 may represent a cap layer for the dielectric material of the layer 306, wherein an upper portion thereof may be modified so as to represent a sublayer 311 having a required degree of electrical conductivity. For this purpose, the layer 307 may be exposed to an appropriate modification process 312 which in some illustrative embodiments may be an ion implantation process, while in other embodiments a plasma-based process for incorporating an appropriate ionic species may be used. In this case, a high degree of flexibility may be provided with respect to the selection of any appropriate species, since even highly exotic materials may be incorporated into a respective base material. Thus, the layer 307 may be formed with any appropriate technique, such as spin-on, CVD and the like, wherein the required "conductive" component may be added without interference of the previous manufacturing process. Respective process parameters for the process 312, if performed as an ion implantation or a plasma-based process, may readily be obtained on the basis of simulation, experience, experiment and the like. Thereafter, the further processing may be continued by forming a respective resist mask or any other etch mask in order to pattern the dielectric layer 306 with increased process uniformity with respect to arcing events, as is previously described.

Figure 3B:
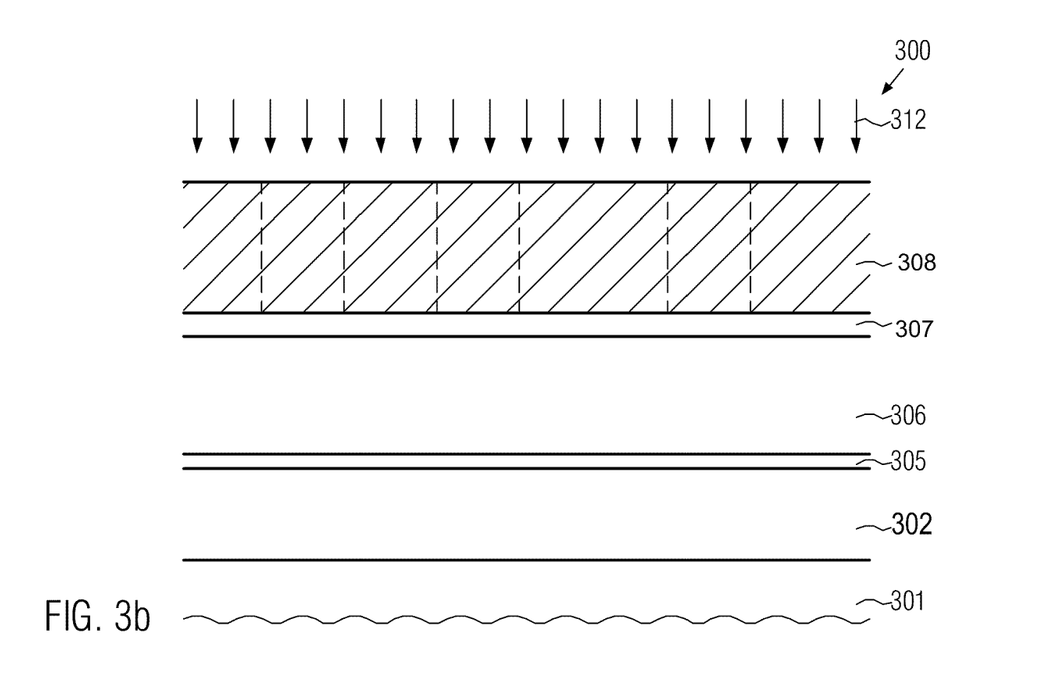

FIG. 3b schematically illustrates the microstructure device 300 according to still further illustrative embodiments. In this case, the device 300 may comprise the layer 307 formed above the dielectric layer 306 to be patterned, wherein the layer 307 may represent an ARC material, wherein, in some illustrative embodiments, additionally or alternatively, a conductive layer may be provided (not shown) as is for instance also described with reference to the device 200, as shown in FIGS. 2a-2b. In other illustrative embodiments, the ARC layer 307 may itself comprise a certain degree of conductivity, as is previously explained. Furthermore, a resist layer 308 may be formed above the layer 307 and may be exposed to the modification process 312, which may be performed as an ion implantation process in order to incorporate an appropriate ion species for modifying the electrical behavior of the resist layer 308. In one illustrative embodiment, the process 312 may be performed after exposing the resist layer 308 so as to not unduly affect the photochemical reaction therein that is initiated by the radiation energy deposited therein during the exposure process. The respective ion species incorporated by the process 312 may enhance the "screening" effect of the layer 308 during the subsequent anisotropic etch process. Thus, a more uniform behavior of the respective etch process may be achieved, even if a substantial charge carrier transport may not be enabled by the corresponding species incorporated into the layer 308. In other cases, a respective metal component may be introduced with high concentration, at least at a specified depth of the layer 308, so as to provide a certain degree of conductivity in the resist layer 308. In other examples, the corresponding component may be substantially uniformly distributed in the height direction, thereby providing a continuous screening or charge transportation effect of the layer 308 during the subsequent anisotropic etch process, even if the layer 308 is also consumed during the etch process. In some illustrative embodiments, the electrically modified resist layer 308 may be combined with an additional conductive layer, such as the layers 311, 211, 211A, 211B, as previously described. Consequently, a highly efficient equalization of the plasma conditions may be achieved on the basis of the modified resist layer 308. After the process 312, the layer 308 may be patterned on the basis of respective development procedures in order to form the respective openings therein, wherein any negative impact of the incorporated ion species may be maintained at a low level, when the exposure of the resist layer 308 has been performed prior to the process 312. Thereafter, the further processing may be continued as is previously described with reference to the device 200.

Figure 3C:
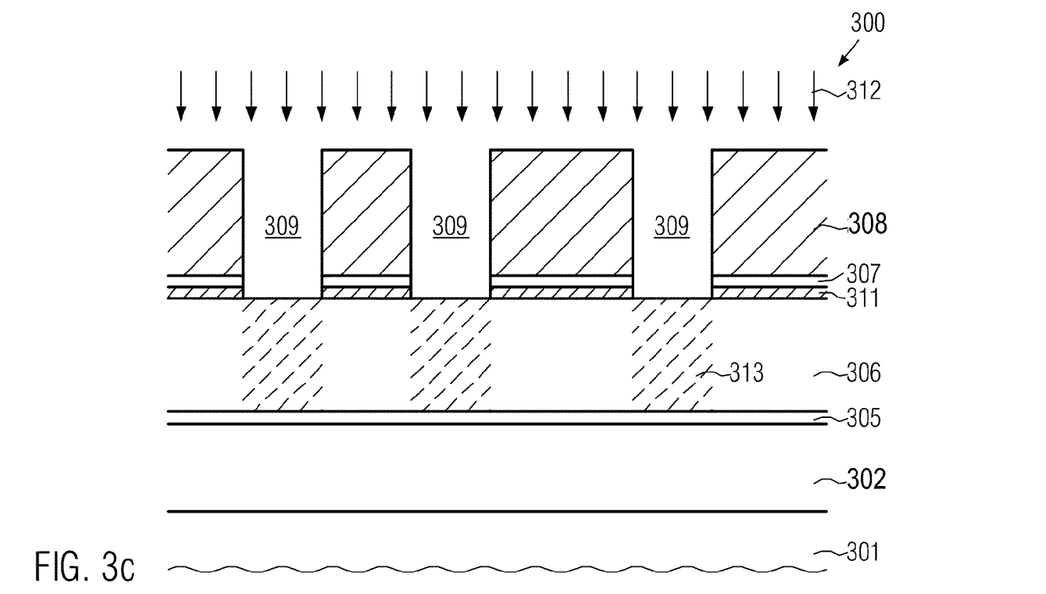

FIG. 3c schematically illustrates the device 300 according to further illustrative embodiments, wherein the process 312 for modifying the electrical characteristics of the layer 308 is performed after patterning the layer 308. Hence, in this manufacturing stage, respective openings 309 may be formed in the resist layer 308 and the ARC layer 307, if provided, and in any other additional conductive layer 311, if provided. For example, the ion implantation process 312 may be controlled such that a corresponding ion species 313 may be introduced into the layer 306, thereby also significantly modifying the local electrical characteristics thereof, wherein an incorporation of the species 313 into portions covered by the resist mask 308 and, if provided, by the optional layers 307 and 311 may be avoided. For this purpose, the corresponding implantation energy may be tailored for the respective species 313 so as to introduce the species 313 down to a desired depth in the layer 306 while substantially not incorporating any species into the covered portions of the layer 306. Depending on the material characteristics of the resist 308, in combination with the optional layers 307 and 311, a respective averaged penetration depth within the layer 306 may be obtained, thereby at least partially significantly altering the corresponding electrical behavior. For instance, a moderately high concentration of a metal material may be incorporated in order to provide a certain degree of conductivity within the exposed portions in the layer 306, thereby enhancing the screening effect with respect to any underlying components, such as conductive areas and the like, as is previously described. Furthermore, depending on the type of material used for the layer 306, the ion bombardment of the process 312 may result in an increased etch rate, thereby possibly compensating for an increased removal rate of the resist mask 308, which may be caused by the ion bombardment 312.

Figure 3D:
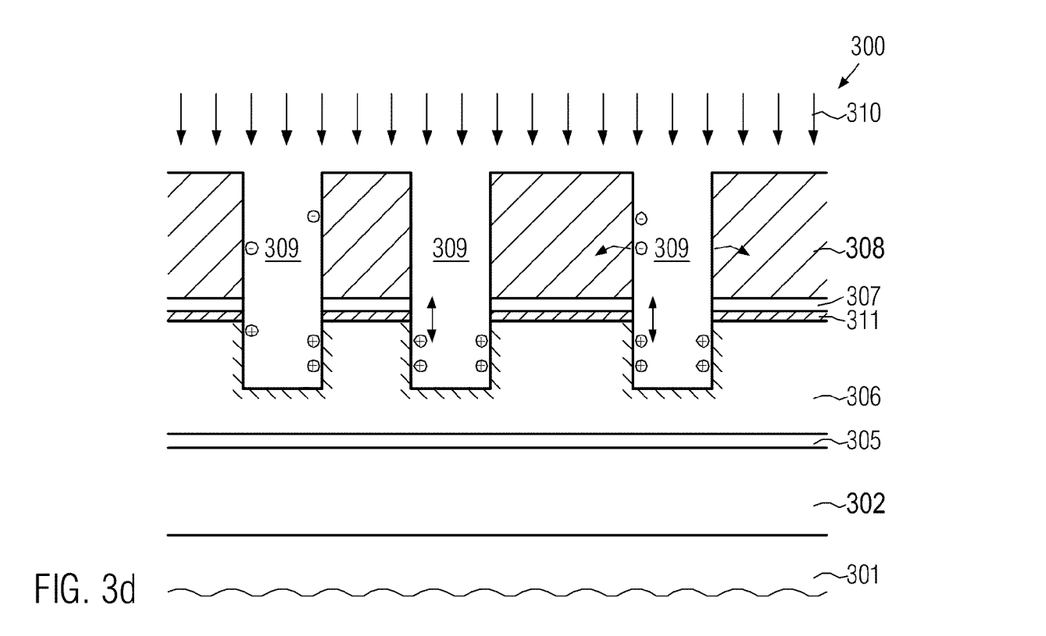

FIG. 3d schematically illustrates the device 300 in a further advanced manufacturing stage, when the device 300 is exposed to an anisotropic etch ambient 310 in order to transfer the openings 309 into the dielectric layer 306. Consequently, due to the modified electrical characteristics, which in the embodiment illustrated in FIG. 3d may include a certain degree of conductivity, may provide a vertical balancing mechanism for the charge separation created by the etch process 310. Consequently, the probability for the generation of an over-critical potential difference within the respective openings 309 may be significantly reduced. It should be appreciated that, depending on the previously obtained penetration depth for the species 313, the effect may at least be obtained down to the respective average penetration depth. Furthermore, at the same time, the modified electrical behavior of the resist mask 308 may provide a lateral discharge of excess charge, thereby enhancing even more the overall uniformity during the process 310. Optionally, an efficient charge carrier transport mechanism may also be established by the layer 311, if provided.

As a result, the subject matter disclosed herein provides an enhanced technique for the formation of openings within a dielectric material, such as via openings, delineation trenches and the like, which have to be formed on the basis of highly anisotropic plasma-assisted etch processes that may lead in conventional techniques to significant arcing events due to the generation of vertical potential differences at respective etch positions. In view of this situation, the subject matter disclosed herein provides an efficient mechanism for laterally distributing charge carriers, thereby efficiently discharging any excess charge carriers which may otherwise accumulate to possibly produce a corresponding arcing event. The lateral distribution of charge carriers may be accomplished on the basis of a respective conductive charge equalization portion, such as a conductive layer, which may be provided at least at specific device regions and which may connect to at least some adjacent areas, thereby providing an efficient mechanism for "averaging" the excess charge over an increased device area and thus reducing the probability for arcing events. Consequently, the respective etch conditions may be made more uniform, thereby also "distributing" the probability for arcing events more uniformly. In some illustrative embodiments, respective conductive layers may be positioned within an etch mask, which may comprise resist materials, ARC materials, hard mask materials and the like, so as to provide the desired lateral conductivity during the etch process. In other illustrative embodiments, the respective electrical behavior may be obtained by a modification process, for instance by the introduction of any appropriate metal species or other species resulting in a certain degree of conductivity, wherein even a resist mask may be used as a lateral charge distribution layer. In some illustrative embodiments, an increased vertical equalization of potential differences may be accomplished by selectively modifying the respective portions of the dielectric material to be etched.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a conductive charge equalization layer above a dielectric layer of a metallization structure of a microstructure device, wherein forming said equalization layer comprises forming an electrically conductive layer configured as an anti-reflective coating, said equalization layer is adapted to connect laterally spaced regions of said dielectric layer, each of said laterally spaced regions is adapted to have an opening formed therein, and each of said openings is adapted to have a conductive material deposited therein; and
    performing a plasma-assisted etch process to form said openings.

2. The method of claim 1, wherein forming said conductive charge equalization layer comprises forming an electrically conductive layer above said dielectric layer.

3. The method of claim 2, further comprising forming a resist layer above said electrically conductive layer.

4. A method, comprising:
    forming a resist layer above a dielectric layer of a metallization structure of a microstructure device,
    forming a conductive charge equalization layer above said resist layer, wherein forming said equalization layer comprises forming an electrically conductive layer, said equalization layer is adapted to connect laterally spaced regions of said dielectric layer, each of said laterally spaced regions is adapted to have an opening formed therein, and each of said openings is adapted to have a conductive material deposited therein; and
    performing a plasma-assisted etch process to form said openings.

5. A method, comprising:
    forming a conductive charge equalization layer above a dielectric layer of a metallization structure of a microstructure device, wherein forming said equalization layer comprises modifying the electrical characteristic of one or more sacrificial dielectric material layers formed above said dielectric layer to obtain a specified conductivity for providing said conductive charge equalization layer, said equalization layer is adapted to connect laterally spaced regions of said dielectric layer, each of said laterally spaced regions is adapted to have an opening formed therein, and each of said openings is adapted to have a conductive material deposited therein; and
    performing a plasma-assisted etch process to form said openings.

6. The method of claim 5, wherein modifying said electrical characteristics of said one or more sacrificial dielectric layers comprises introducing an ion species by an ion implantation process.

7. The method of claim 6, wherein at least a part of said ion implantation process is performed prior to patterning a resist layer used to form said openings.

8. The method of claim 6, wherein at least a part of said ion implantation process is performed after patterning a resist layer used to form said openings.

9. A method, comprising:
    forming a sacrificial layer above a dielectric layer of a metallization structure of a microstructure device;
    patterning said sacrificial layer to form an etch mask;
    modifying an electrical behavior of said sacrificial layer by introducing an ion species thereto, wherein at least a portion of said ion species is introduced after patterning said sacrificial layer; and
    forming a plurality of laterally spaced openings in said dielectric layer based on a plasma-assisted etch process using said etch mask.

10. A method, comprising:
    forming a sacrificial layer above a dielectric layer of a metallization structure of a microstructure device;
    modifying an electrical behavior of said sacrificial layer by introducing an ion species thereto;
    forming a conductive area adapted as an anti-reflective layer for a resist layer of said sacrificial layer, wherein said conductive area comprises one or more sub-layers of said sacrificial layer;
    patterning said sacrificial layer to form an etch mask;
    forming a plurality of laterally spaced openings in said dielectric layer based on a plasma-assisted etch process using said etch mask, said conductive area connecting at least some of said plurality of laterally spaced openings.

11. A method, comprising:
   forming a mask layer above a dielectric layer of a metallization structure of a microstructure device, wherein forming said mask layer comprises forming a resist layer and forming an electrically conductive layer adapted as an anti-reflective layer on said resist layer;
   patterning said mask layer to obtain an etch mask adapted for forming a plurality of openings in said dielectric layer; and
   forming said plurality of openings by a plasma-assisted etch process using said etch mask.

12. The method of claim 11, further comprising modifying an electrical behavior of at least a portion of said mask layer by introducing a specified ion species.

13. A method, comprising:
   forming a mask layer above a dielectric layer of a metallization structure of a microstructure device, wherein forming said mask layer comprises forming an electrically conductive layer adapted as an anti-reflective layer and forming a resist layer on said electrically conductive layer;
   patterning said mask layer to obtain an etch mask adapted for forming a plurality of openings in said dielectric layer; and
   forming said plurality of openings by a plasma-assisted etch process using said etch mask.

* * * * *